United States Patent

Matsui et al.

[11] Patent Number: 5,923,539
[45] Date of Patent: Jul. 13, 1999

[54] MULTILAYER CIRCUIT SUBSTRATE WITH CIRCUIT REPAIRING FUNCTION, AND ELECTRONIC CIRCUIT DEVICE

[75] Inventors: Kiyoshi Matsui; Ryohei Satoh, both of Yokohama; Michifumi Kawai, Tokyo; Masashi Ohkubo, Yokohama; Yutaka Watanabe, Hadano; Masakazu Yamamoto, Hadano; Tsutomu Imai, Hadano; Shinji Abe, Hadano; Hiroyuki Hidaka, Hadano, all of Japan

[73] Assignee: Hitachi, Ltd., Tokyo, Japan

[21] Appl. No.: 08/547,988

[22] Filed: Oct. 25, 1995

Related U.S. Application Data

[62] Division of application No. 08/004,969, Jan. 15, 1993, abandoned.

[30] Foreign Application Priority Data

Jan. 16, 1992 [JP] Japan ................................. 4-005830

[51] Int. Cl.$^6$ ............................... H05K 1/11; H05K 1/14
[52] U.S. Cl. ........................ 361/777; 174/255; 174/261; 361/795; 361/778
[58] Field of Search ........................... 29/847; 174/250, 174/255, 260, 261; 257/209, 529, 700, 530, 665; 361/748, 760, 777, 778, 779, 780, 783, 792–795; 439/47, 48, 69, 74

[56] References Cited

U.S. PATENT DOCUMENTS 4,706,165  11/1987  Takenaka et al. ..................... 361/777
4,974,048  11/1990  Chakravorty et al. .
5,060,116  10/1991  Grobman et al. ...................... 361/777

FOREIGN PATENT DOCUMENTS 62-25437  2/1987  Japan .
63-213399  6/1988  Japan .

OTHER PUBLICATIONS

The ES/9000 Glass Ceramic Thermal Conduction Module Design for Manufacturability, Hardin, et al. IEEE/CHMT'91 IEMT Symposium, pp 351–355.

Micro Electronics Packaging Hand Book, FIG. 1–28, Nikkey BP Co., Mar. 27, 1991.

*Primary Examiner*—Donald Sparks
*Attorney, Agent, or Firm*—Fay, Sharpe, Beall, Fagan, Minnich & McKee

[57] ABSTRACT

A multilayer circuit substrate with a circuit repairing function which has a circuit substrate having a circuit pattern and repair pattern on the inner layer via an inter-substrate insulation film and having circuit repairing areas for cutting and bonding the circuit on these patterns, a terminal bonding pad for bonding electronic circuit parts mounted on this substrate, and a conductive via hole for bonding said circuit pattern to the terminal bonding pad, wherein at least the circuit repairing area of the repair pattern and at least the circuit repairing area of said circuit pattern which are set on said inner layer are brought close to each other and positioned on the same plane.

10 Claims, 16 Drawing Sheets

MULTILAYER CIRCUIT SUBSTRATE WITH CIRCUIT REPAIRING FUNCTION, AND ELECTRONIC CIRCUIT DEVICE

This application is a divisional of U.S. application Ser. No. 08/004,969, filed Jan. 15, 1993, now abandoned.

BACKGROUND OF THE INVENTION

The present invention relates to a multilayer circuit substrate with a circuit repairing function, a circuit repairing method for the substrate, and an electronic circuit device with electronic parts mounted to the circuit substrate.

In electronic circuit devices which are mounted with many LSIs which can be operated rapidly and highly integrated, the high density packaging technology on each circuit substrate is very important. By realizing high density packaging, the length of each circuit line between LSIs can be shortened, and the intra-substrate pattern delay time of an electric signal can be shortened, and high speed operations as an electronic circuit device can be realized.

One of the high density packaging technologies is a flip chip packaging method, for example, for forming a metal bump such as solder on the electrode on the surface of an LSI chip and for bonding the above chip onto the circuit substrate with face down via the bump.

By high integration of LSIs, the number of I/O terminals of each LSI chip increases and the number of signal lines in the circuit substrate also increases, so that it is necessary to realize a multilayered circuit substrate for mounting LSIs. Therefore, to produce circuit substrates, a technology for forming fine multi-point electrode terminals and a technology for patterning multilayer circuits are required.

Such a multilayer circuit substrate requires repairing of faulty parts of the fine pattern manufacturing process or repairing of the circuit so as to change the logic between LSIs after they are mounted to the substrate. Concretely, it is required to change the circuit, for example, due to the problems indicated below.

(1) Faulty design of the circuit
(2) Faulty manufacture
(3) Faulty LSI operations due to the signal propagation delay time generated on a circuit line or defects of the circuit pattern
(4) Design changes for improving the performance of the electronic circuit device Therefore, the multilayer circuit substrate requires a repair pattern structure for changing the circuit which will not reduce the packaging density and LSI operation performance, and various structures have been proposed.

For example, as one of the means, a method for changing the circuit by installing a repair pattern bonding pad or engineering change (EC) pad near the projection surface of electronic circuit parts mounted on a multilayer circuit substrate and by wire-bonding the pad is well known.

However, this means installs a repairing pad on the surface oE the circuit substrate, so that the electronic circuit part mounting density (total area of the mounted electronic circuit parts/area of the circuit substrate) for the circuit substrate reduces remarkably. Repairing methods relating to this type of technology are indicated in, for example, Japanese Patent Laid-Open No. 62-25437 and Microelectronics Packaging Handbook (p. 39, FIGS. 1 to 28, Nikkei BP, Mar. 27, 1991).

As a means for improving this mounting density, a method for improving the pad structure installed on the circuit substrate so as to reduce the occupied area of the repairing pad is proposed. According to this method, (1) as pads for bonding the electronic part terminals installed on the surface layer of the substrate, a cutting pad in repairing and a repair pattern bonding pad are installed, and an intra-substrate circuit pattern bonded via this cutting pad in repairing and a repair pattern which is bonded to the repair pattern bonding pad for repairing are installed on the inner layer of the substrate, and the cutting pad in repairing bonded to the terminal bonding pad installed on the surface layer is separated from the terminal bonding pad on the one hand for repairing and a special via hole, or simply "via" is installed between the repair pattern bonding pad bonded to the terminal bonding pad on the surface layer and the repair pattern installed on the inner layer on the other hand so as to bond the two. Furthermore, (2) the above repair pattern is installed in the substrate as a two-layer structure and a conductive via hole, formed for channel change indicating the conductive through hole location for channel change, is installed at the location where via connection between these two layers is possible on the surface layer as a repair pattern bonding pad mentioned above. A repairing method relating to this type of technology is indicated in, for example, Japanese Patent Laid-Open No. 63-213399.

The latter repairing method is superior to the former repairing method in the respect that the occupied area of a repairing pad installed on the circuit substrate can be reduced. However, since the cutting pad in repairing, which is separated from the terminal bonding pad for repairing, and the repair pattern bonding pad still exist on the substrate, the following problems are imposed.

(1) Since the cutting pad in repairing and repair pattern bonding pad are installed on the surface of the multilayer circuit substrate as repairing pads in addition to the terminal bonding pad, the electronic circuit part mounting density for the circuit substrate is still low and not sufficiently high for high density packaging.

(2) When a design change or faulty LSI operation is caused after an LSI chip is mounted on the multilayer circuit substrate by the flip chip packaging method, it is necessary to remove the LSI chip and remount a new LSI chip. This is generally referred to as repair. In this case, surplus solder remains on the terminal bonding pad on the substrate after the unnecessary LSI chip is removed, so that the leveling process (surplus solder on the terminal bonding pad is removed by a metal plate which is wettable with solder, for example, a Cu plate) is generally necessary.

However, since the above prior art uses a cutting pad in repairing and repair pattern bonding pad as terminal bonding pads, the following problems are caused in the leveling process by repair. Surplus solder which is wetted with the Cu plate [1] spreads to the cutting pad in repairing in the wetting state and bonds the cutting pad in repairing, which is separated from the terminal bonding pad, to the terminal bonding pad once again, [2] spreads to the repair pattern bonding pad in the wetting state, causes the repair pattern bonding location to be hardly recognized, and reduces the efficiency of the via hole boring process using a laser beam simultaneously, and [3] bores via holes by a laser beam using the repair pattern bonding location and conductive through hole location for channel change, which are set on the surface layer of the substrate, as reference points so as to electrically bond the repair pattern bonding pad on the surface layer of the substrate and the repair pattern which is set on the inner layer of the substrate as a two-layer structure which form a circuit pattern repairing path. However, positioning of the above via holes requires positioning accuracy of three layers in total including the pad on the surface layer of the substrate and the repair pattern on the inner layer. Therefore, when the multilayer circuit substrate increases in size, the positioning accuracy is easily affected by the warp and degree of shrinkage of the substrate and the pattern mask positioning accuracy on each layer and it is difficult to bore highly accurate via holes.

SUMMARY OF THE INVENTION

The objects of the present invention are to solve the problems inherent in the aforementioned prior art. The first object is to provide a multilayer circuit substrate with a circuit repairing function which is improved for high density packaging, and the second object is to provide a circuit repairing method for the circuit substrate, and the third object is to provide an electronic circuit device with electronic parts mounted on the substrate.

To accomplish the above objects, the present invention uses a structure that the cutting pad in repairing and repair pattern bonding pad are removed from the surface of the circuit substrate and the circuit pattern provided on the inner layer of the substrate is directly cut off from the inner layer and connected to the nearest repair pattern. A circuit pattern, repair pattern, and repair main pattern are set on the inner layer of the substrate and arranged on the same plane. The circuit pattern is positioned close to the repair pattern.

Furthermore, the present invention uses a structure that between the multilayer circuit substrate and electronic circuit parts mounted thereon, a circuit repairing substrate whereon the above circuit pattern and repair pattern are arranged is installed.

DESCRIPTION OF THE PREFERRED EMBODIMENTS

Figure 1:
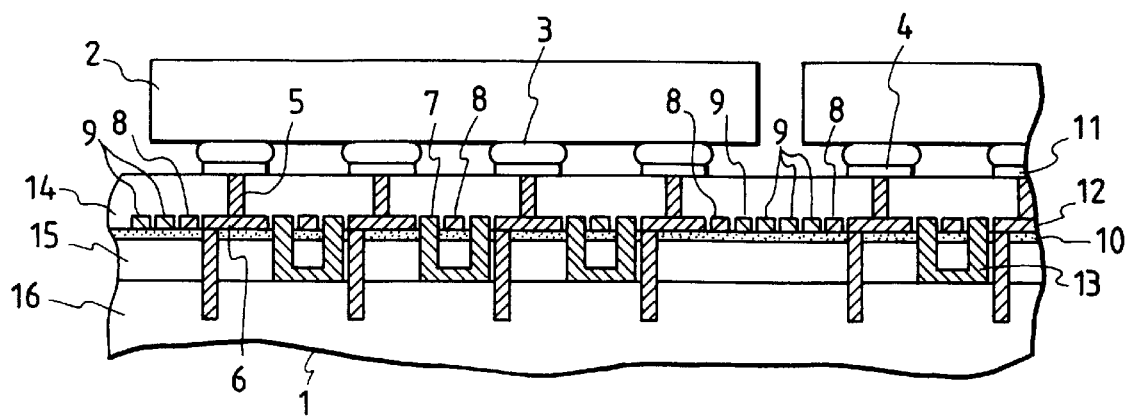
FIG. 1 is a sectional view of the essential section of a multilayer circuit substrate and electronic circuit device of an embodiment of the present invention.

The objects of the present invention are to solve the problems inherent in the aforementioned prior art. The first object is to provide a multilayer circuit substrate with a circuit repairing function which is improved for high density packaging, and the second object is to provide a circuit repairing method for the circuit substrate, and the third object is to provide an electronic circuit device with electronic parts mounted on the substrate.

To accomplish the above objects, the present invention uses a structure that the cutting pad in repairing and repair pattern bonding pad are removed from the surface of the circuit substrate and the circuit pattern provided on the inner layer of the substrate is directly cut off from the inner layer and connected to the nearest repair pattern. A circuit pattern, repair pattern, and repair main pattern are set on the inner layer of the substrate and arranged on the same plane. The circuit pattern is positioned close to the repair pattern.

Furthermore, the present invention uses a structure that between the multilayer circuit substrate and electronic circuit parts mounted thereon, a circuit repairing substrate whereon the above circuit pattern and repair pattern are arranged is installed.

Next, the concrete means for accomplishing the objects of the present will be explained. First, the first object is accomplished by using a multilayer circuit substrate with a circuit repairing function or circuit repairing substrate which has [1] a circuit substrate having a circuit pattern and repair pattern on the inner layer via an inter-substrate insulation film and having circuit repairing areas for cutting and bonding the circuit on the above patterns, [2] a terminal bonding pad for bonding electronic circuit parts mounted on the above substrate, and [3] a conductive via hole for bonding the above circuit pattern to the terminal bonding pad, wherein at least the circuit repairing area of the repair pattern and at least the circuit repairing area of the above circuit pattern which are set on the above inner layer are brought close to each other and positioned on the same plane.

It is desirable to arrange at least the circuit repairing area of the above repair pattern and at least the circuit repairing area of the above repair pattern close to each other and arrange the above repair pattern so that it encloses the above circuit pattern on the same plane, to construct the above repair pattern with a crossing two-way lattice pattern so that it encloses this circuit pattern, and to position at least the essential section thereof on the plane where the above circuit pattern is set.

It is also desirable to set the above circuit repairing area for cutting and repairing outside the projection area of the above terminal bonding pad in consideration of the boring process for circuit repairing. The crossing part of the above repair patterns, which are constructed with a crossing two-way lattice pattern, may be a three-dimensional crossing part wherein one of the repair patterns is bonded to the lower layer pattern via the conductive via hole and the two are kept insulated via the inter-substrate insulation film or may be of a structure that the two are bonded to each other so as to keep electrical continuity.

Mounting areas where a plurality of electronic circuit parts are mounted in the matrix state are formed close to each other on the above circuit substrate and the repairs shown in Items 1) and 2) can be made.

1) It is desirable to arrange a repair main pattern in the matrix state of a crossing two-way lattice pattern along the periphery of the above projection surface of the mounting area in the inner layer area between the above neighboring mounting areas on the plane where the above circuit pattern and repair pattern are set. By doing this, the circuit between the electronic circuit part mounting areas neighboring with each other via the above repair main pattern and repair pattern can be repaired.

2) The above repair pattern is arranged in the inner layer area of the above projection surface of the mounting area, and the end of the repair pattern extends to the periphery of the above projection surface of the mounting area and is bonded to the repairing pad mounted on the surface layer at the end via the via hole, and the circuit between the electronic circuit parts mounted on the circuit substrate can be repaired by bonding the repairing pads to be repaired by means of wire bonding or ribbon bonding.

The crossing part of the repair patterns, described in Item 1), which are constructed with a crossing two-way lattice pattern may be a three-dimensional crossing part wherein one of the repair patterns is bonded to the lower layer pattern via the conductive via hole and the two are kept insulated via the inter-substrate insulation film or may be of a structure that the two are bonded to each other so as to keep electrical continuity in the same way as with the above repair pattern. At least the essential sections of the above crossing two-way repair pattern and the above repair main pattern are arranged on the same plane. It is desirable to arrange a barrier which is an insulation film, for example, an oxide film or nitrid film between the above repair pattern, repair main pattern, circuit pattern, and inter-substrate insulation film thereunder so as to prevent the insulation film thereunder from damage during boring.

The second object is accomplished by the above circuit repairing method using a multilayer circuit substrate having [1] a process for removing the insulation film from the circuit cut repairing area wherein a circuit pattern and repair pattern are predetermined and for cutting each exposed circuit line in the above repairing area and [2] a process for removing the insulation film from the above circuit repairing area wherein the circuit pattern and repair pattern are predetermined and for bonding the above exposed circuit lines in the repairing area mutually with conductors.

Furthermore, the second object may be accomplished by the above circuit repairing method using a multilayer circuit substrate having [1] a process for removing the insulation film from the circuit cut repairing area wherein a circuit pattern, repair pattern, and repair main pattern are predetermined and for cutting each exposed circuit line in the above repairing area and [2] a process for removing the insulation film from the above circuit repairing area wherein the circuit pattern, repair pattern, and repair main pattern are predetermined and for bonding the above exposed circuit lines in the repairing area mutually with conductors, whereby the circuit between the electronic circuit part mounting areas neighboring with each other via the above repair pattern and repair main pattern can be repaired.

It is desirable that [1] the above process for removing the insulation film from the circuit cut repairing area and for cutting the exposed circuit lines in the repairing area is constructed with a process for boring a hole in the insulation film by irradiating a laser beam and a subsequent process for melting circuit lines by irradiating a laser beam and [2] the above process for removing the insulation film from the circuit repairing area and for bonding the above exposed circuit lines in the repairing area mutually with conductors is constructed with a process for boring a hole in the insulation film by irradiating a laser beam and a process for bonding the exposed circuit lines mutually with conductors.

The above process for bonding circuit lines mutually with conductors may be, for example, a process for supplying a bonding material such as solder into the opening and melting it for bonding each circuit line, or a process for depositing a conductor on each exposed circuit line by laser CVD for bonding it, or a process for bonding each circuit line by means of wire bonding or ribbon bonding.

In the above process for boring a hole in the insulation film by irradiating a laser beam, the boring hole diameter in the insulation film in the circuit cut repairing area is required to be extremely smaller than the boring hole diameter in the insulation film in the circuit repairing area. By doing this, surplus solder is prevented from entering into the opening wherein the cut is repaired in the leveling process so as to prevent the circuit cut part from rebonding. On the other hand, a conductor is put into the hole in the circuit repairing area so as to bond the neighboring circuits, so that the hole diameter is made wide enough for accommodating bonding material such as solder easily.

For bonding the above repairing pads, a wire bonding or ribbon bonding process is used.

The third object is accomplished by an electronic circuit device wherein electronic circuit parts are mounted on a multilayer circuit substrate by which the first object is accomplished and the terminal bonding pad mounted in the mounting area on the above substrate and the terminals of the electronic circuit parts are electrically bonded. Many electronic circuit parts such as LSIs are generally mounted on the substrate in the matrix state and high density packaging is realized. This type of circuit substrate is constructed so that the second thin multilayer circuit substrate is intergrated by being bonded onto the first thick layer substrate with an I/O terminal bonded thereto. This first thick layer substrate is generally provided with a pin on the back as an I/O terminal and with bonding terminals for forming a second thin multilayer circuit substrate on the front and constructed with a rigid multilayer circuit substrate such as a ceramic or glass epoxy substrate.

Furthermore, the third object is accomplished by an electronic circuit device wherein the above circuit repairing substrate by which the first object is accomplished is bonded to the above multilayer circuit substrate, and electronic circuit parts are mounted on the above circuit repairing substrate, and the terminal bonding pad mounted in the mounting area on the above multilayer circuit substrate, the terminal bonding pad on the circuit repairing substrate, and the terminals of the electronic circuit parts are electrically bonded to each other.

According to the multilayer circuit substrate with a circuit repairing function of the present invention, right under the electronic circuit parts mounted on the multilayer circuit substrate, in further detail, outside the projection area of the terminal bonding pad, the repair circuit line process can be performed and various conventional repairing pads are removed from the substrate surface. Therefore, the electronic circuit part mounting density can be increased substantially.

By setting a circuit pattern on the inner layer of the substrate and by cutting a part of the circuit pattern on the one hand and bonding it on the other hand for repairing, the problem that surplus solder in the leveling process rebonds the cut part can be solved. In other words, the diameter of a hole which is made on the insulation film on the circuit pattern for cutting and opened is made smaller than that for bonding and solder is prevented from entering into it. For example, when the hole diameter of the cut part which is set by the above cutting is set to 30 to 50 μm and the hole diameter of the bonding part is set to 100 to 150 μm, solder can be supplied selectively only to the bonding part.

Since the cutting pad in repairing and repair pattern bonding pad are removed from the substrate surface, surplus solder in the leveling process can be prevented from wet spreading.

In circuit repairing, the circuit is cut only by cutting off the circuit repairing area of a predetermined pattern by a laser beam and the circuit is bonded by bonding the bonding areas of patterns, which are arranged on the same plane close to each other, via a conductor such as solder on the surfaces thereof.

By setting the circuit pattern, repair pattern, and repair main pattern on the same plane, only one pattern mask is used for circuit forming, and the inter-pattern positioning accuracy is improved, and the cutting position and inter-pattern bonding position can be easily fixed.

Next, the embodiments of the present invention will be explained with the accompanying drawings.

Embodiment 1

FIG. 1 is a sectional view of the essential section of a multilayer circuit substrate with a circuit repairing function relating to an embodiment of the present invention. This type of circuit substrate is generally constructed so that the second thin multilayer circuit substrate is intergrated by being bonded onto the first thick layer substrate with an I/O terminal bonded thereto. Although this first thick layer substrate is omitted in this drawing, it is generally provided with a pin on the back of the above thick substrate as an I/O terminal and with bonding terminals for forming a second thin multilayer circuit substrate on the front thereof and constructed with a rigid multilayer circuit substrate such as a ceramic or glass epoxy substrate. The drawing shows a state that LSIs, which are electronic parts, are mounted on the second thin multilayer circuit substrate, which is a characteristic of the present invention.

In the drawing, numeral 1 indicates a multilayer circuit substrate of the present invention which constitutes the above second thin multilayer circuit substrate, 2 an LSI chip, 3 a solder bump, 4 a terminal bonding pad, 5 a conductive via hole, 6 a circuit pattern, 7 a repair pattern X (arranged in the X direction), 8 a repair pattern Y (arranged in the Y direction), 9 a repair main pattern, 10 an insulation film forming a barrier, 11 a first pattern having the terminal bonding pads 4 on the surface layer of the substrate 1, 12 a second pattern having the circuit pattern 6, repair pattern X 7, repair pattern Y 8, and repair main pattern 9 on the inner layer of the substrate 1, 13 a third pattern having the circuit pattern 6, repair pattern X 7, and repair main pattern 9 on the inner layer of the substrate 1, 14 a first inter-substrate insulation film in the substrate 1, 15 a second inter-substrate insulation film in the substrate 1, and 16 a third inter-substrate insulation film in the substrate 1. These inter-substrate insulation films 14 to 16 are constructed with, for example, organic insulation films such as polyimide or polyamide which can be easily patterned.

Figure 2:
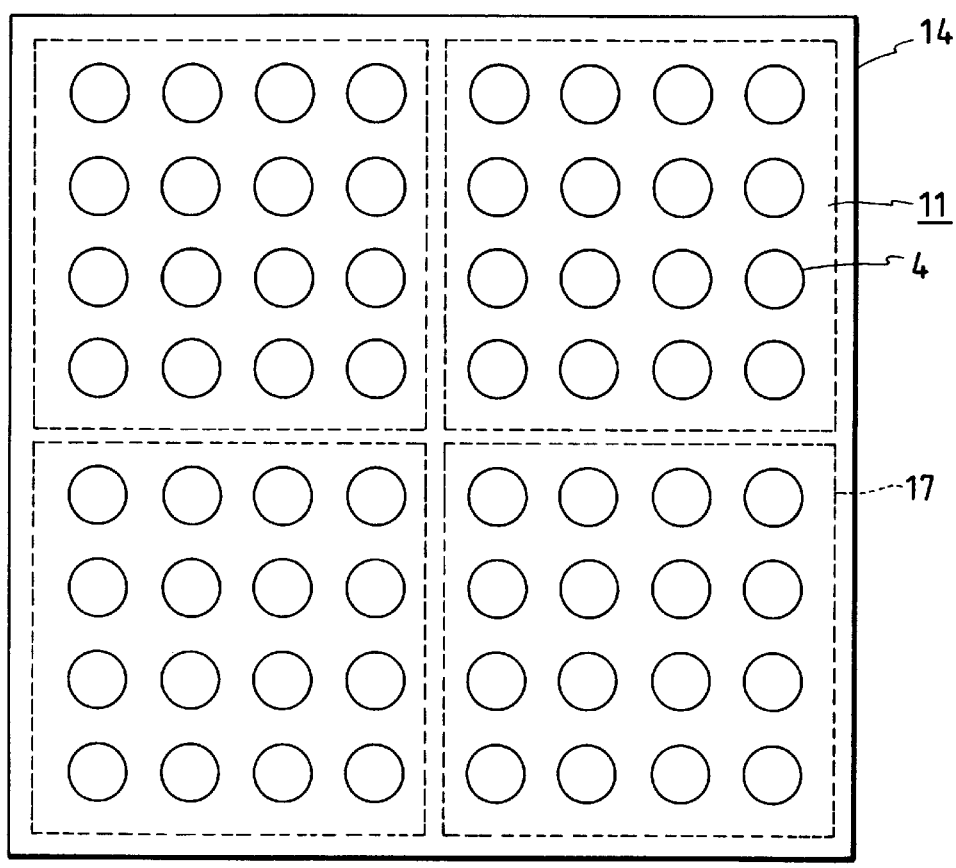
FIG. 2 is a plan view of a first pattern 11 of a multilayer circuit substrate of an embodiment of the present invention.
Figure 3:
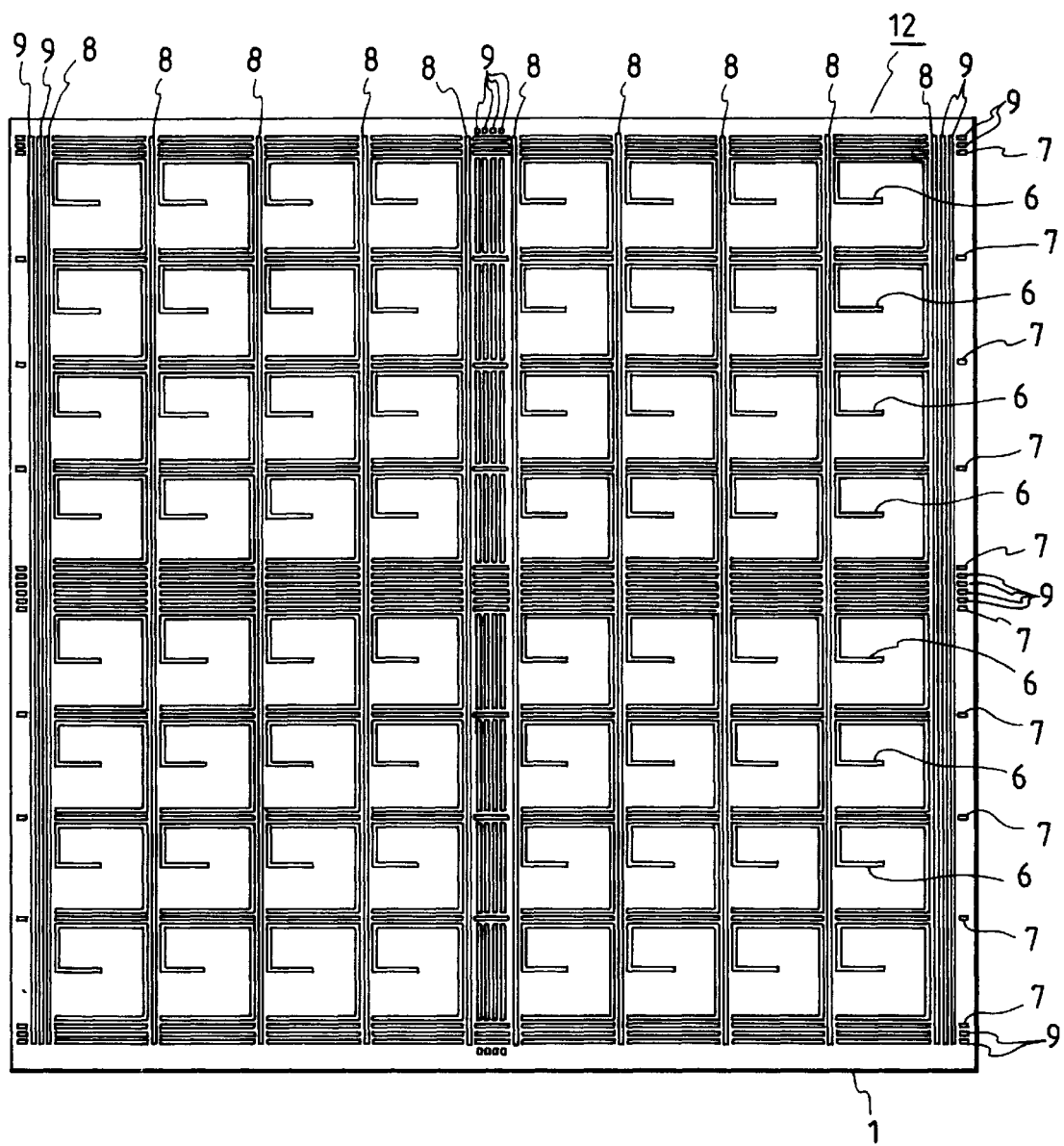
FIG. 3 is a plan view of a second pattern 12 of the multilayer circuit substrate shown in FIG. 2.
Figure 4:
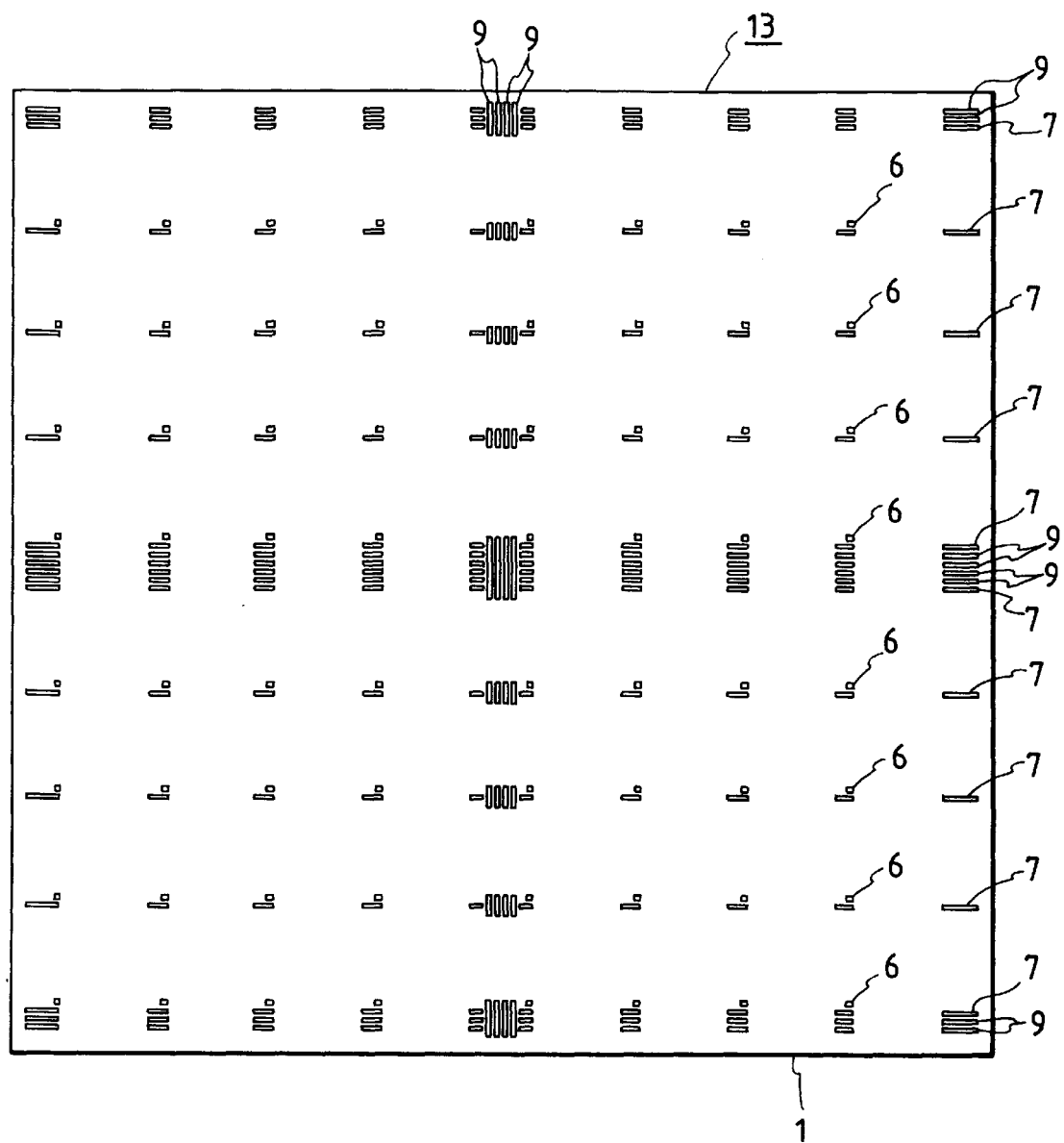
FIG. 4 is a plan view of a third pattern 13 of the multilayer circuit substrate shown in FIG. 2.

FIGS. 2 to 4 are plan views of the patterns 11 to 13 in the multilayer circuit substrate shown in FIG. 1.

FIG. 2 shows the pattern 11 on the inter-substrate insulation film 14 which is a surface layer of the substrate 1. Numeral 17 indicates an LSI chip mounting area. In this drawing, there are 16 terminal bonding pads 4 provided for each LSI and 4 LSI chips are mounted on one substrate.

FIG. 3 shows the pattern 12 on the inter-substrate insulation film 15 (shown in FIG. 1) which is an inner layer of the substrate. The repair pattern X 7 and repair pattern Y 8 which exist right under each terminal bonding pad 4 (shown in FIG. 1) are arranged in the lattice state and the circuit pattern 6 is arranged close to each repair pattern X 7 and repair pattern Y 8. The repair main pattern 9 is arranged along the four sides of each LSI chip mounting area 17 (shown in FIG. 2). The circuit patterns cross three-dimensionally at the crossing part via the insulation film 15 as shown in the sectional view in FIG. 1.

FIG. 4 shows the pattern 13 on the inter-substrate insulation film 16 shown in FIG. 1 and a repair pattern crossing pattern which is provided so as to keep insulation between the patterns at the conductive via hole forming position bonded to the circuit pattern 6, the right-angled part of the repair pattern X 7 and repair pattern Y 8 shown in FIG. 3, and the right-angled part of the repair main patterns 9.

The aforementioned repair pattern structure in the multi-layer circuit substrate 1 and the principle of the repairing method will be described with reference to FIG. 5a to FIG. 12c.

FIGS. 5a to 5c and FIGS. 6a to 6c are enlarged views of the peripheral part of one terminal bonding pad 4. The drawings show an example of repair pattern bonding that at the right-angled part of the repair pattern X 7 and repair pattern Y 8, the repair pattern X 7 is bonded to the under-layer pattern via the conductive via hole 5 so as to keep insulation between them.

Figure 5A:
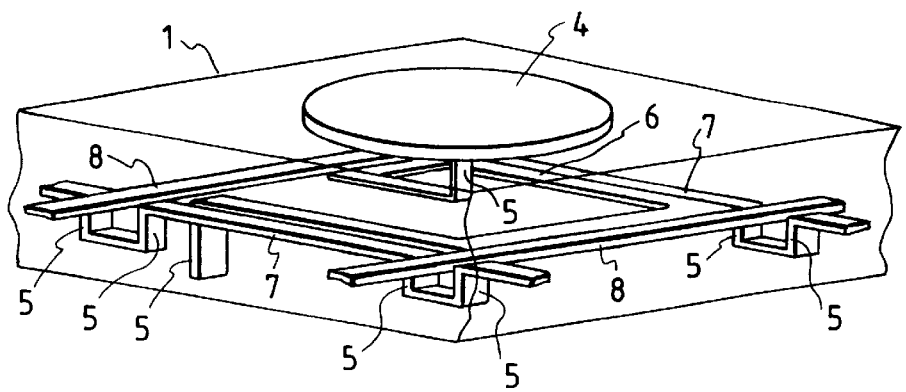
FIGS. 5a to 5c are enlarged views of the essential section of a multilayer circuit substrate of the present invention before circuit pattern repairing.
Figure 5B:
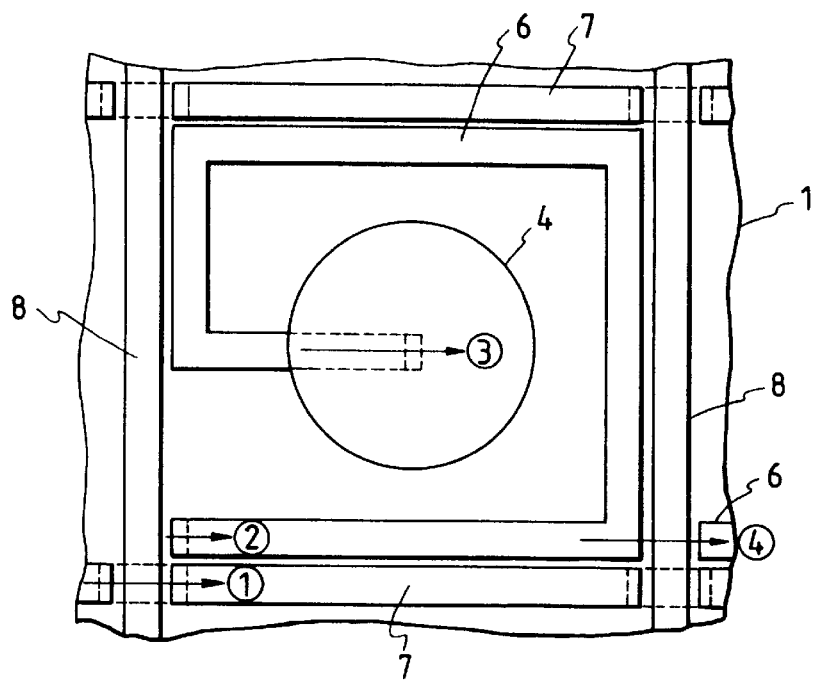
Figure 5C:
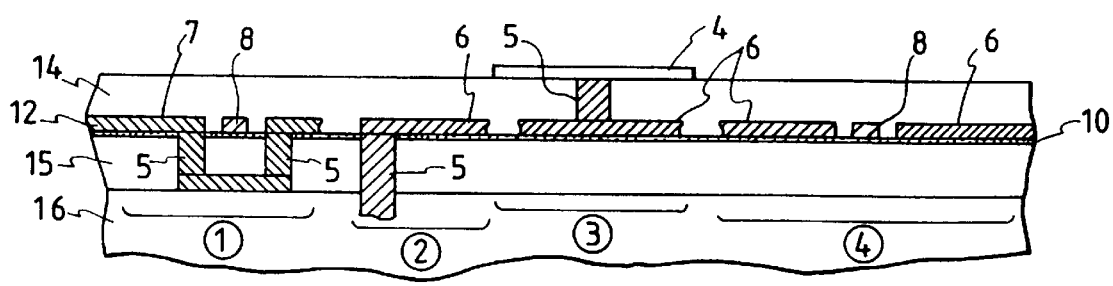

FIGS. 5a to 5c show the circuit pattern structure before main pattern repairing (initial state). FIG. 5a is a perspective squint drawing, and FIG. 5b is a top view, and FIG. 5c is a sectional view along the arrows [1] to [4] shown in FIG. 5b.

As shown in FIG. 5a, the terminal bonding pad 4 on the surface layer of the substrate 1 is bonded to the circuit pattern 6 via the conductive via hole 5. The circuit pattern 6 is arranged close to the repair pattern X 7 and repair pattern Y 8 on the layer around the terminal bonding pad 4. In other words, on the inner layer of the substrate (second pattern 12), the circuit pattern 6, repair pattern X 7, and repair pattern Y 8 are arranged structurally on the same plane.

As shown in FIG. 5b, the circuit pattern 6 and repair pattern X 7 and the circuit pattern 6 and repair pattern Y 8 are arranged structurally so as to hold the minimum pattern interval for keeping the two insulated respectively.

Figure 6A:
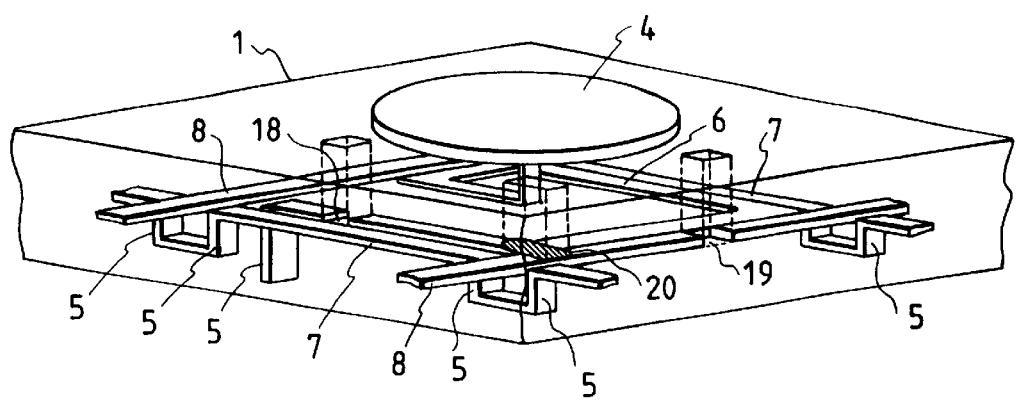
FIGS. 6a to 6c are enlarged views of the essential section of the multilayer circuit substrate shown in FIGS. 5a to 5c after circuit pattern repairing.
Figure 6B:
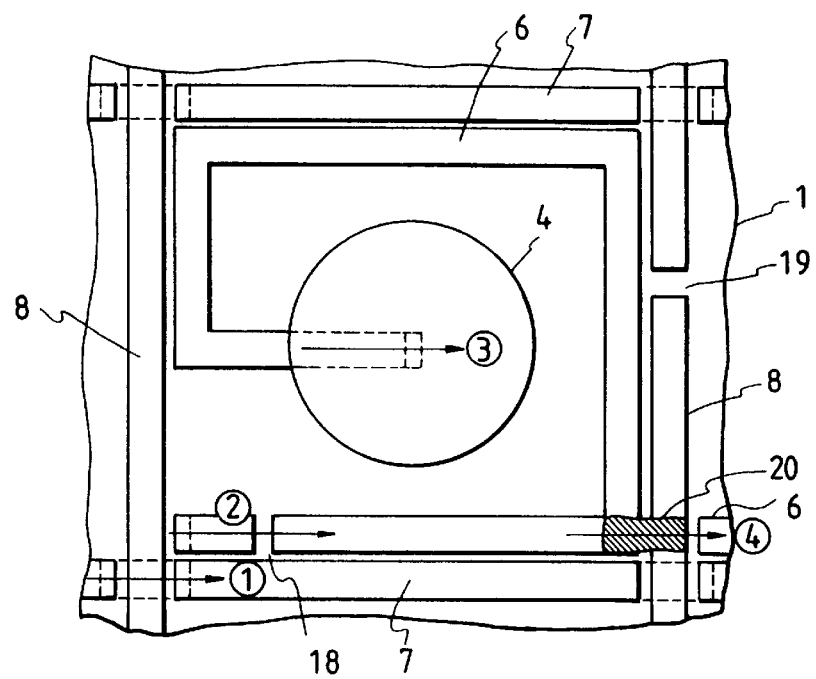
Figure 6C:
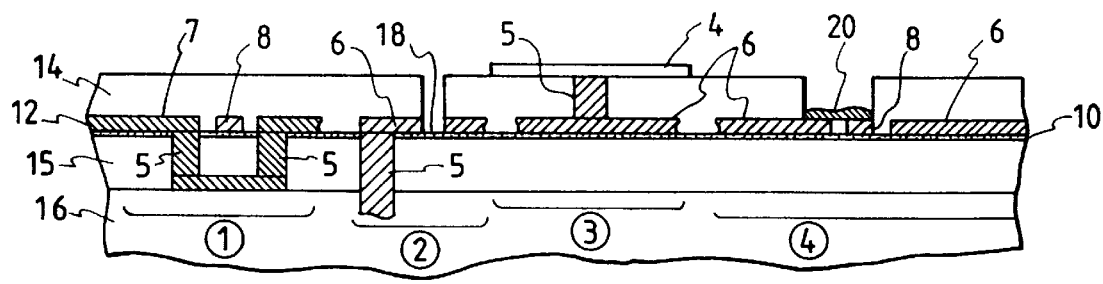

FIGS. 6a to 6c show the circuit pattern structure after the circuit pattern shown in FIGS. 5a to 5c is repaired. FIG. 6a is a perspective squint drawing, and FIG. 6b is a top view, and FIG. 6c is a sectional view along the arrows [1] to [4] shown in FIG. 6b.

FIGS. 7a to 7c and FIGS. 8a to 8c show an example that the pattern structure of the repair pattern X 7 and repair pattern Y 8 is different from that shown in FIGS. 5a to 6c. The drawings show an example of repair pattern bonding that the two are bonded to each other at the right-angled part in the electrical continuity state.

Figure 7A:
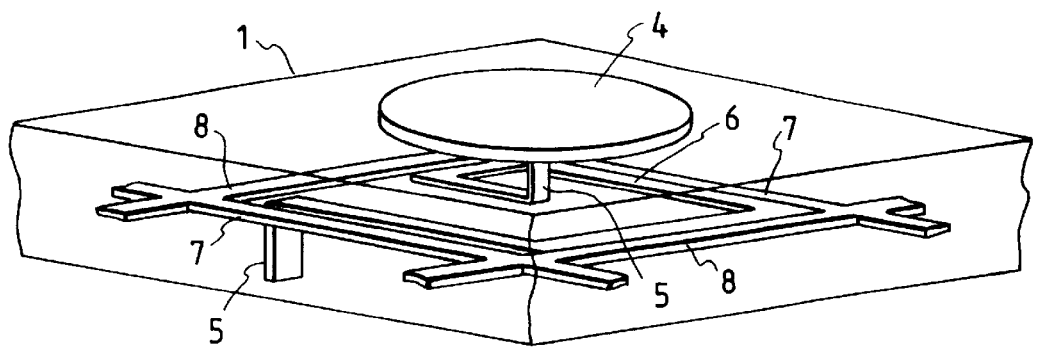
FIGS. 7a to 7c are enlarged views of the essential section of a multilayer circuit substrate of another embodiment of the present invention before circuit pattern repairing.
Figure 7B:
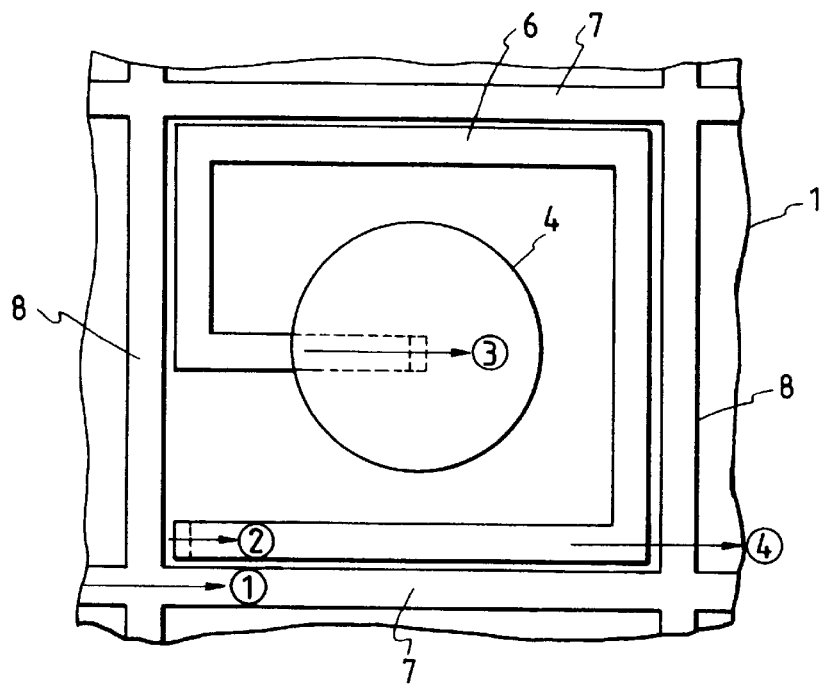
Figure 7C:
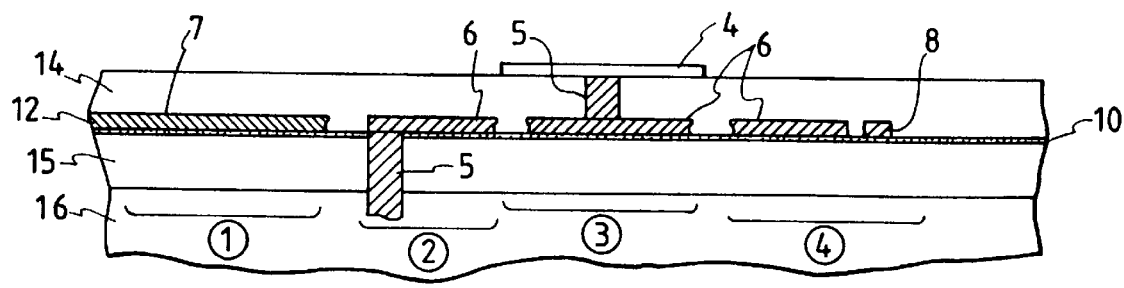

FIGS. 7a to 7c show the circuit pattern structure before main pattern repairing (initial state). FIG. 7a is a perspective squint drawing, and FIG. 7b is a top view, and FIG. 7c is a sectional view along the arrows [1] to [4] shown in FIG. 7b.

Figure 8A:
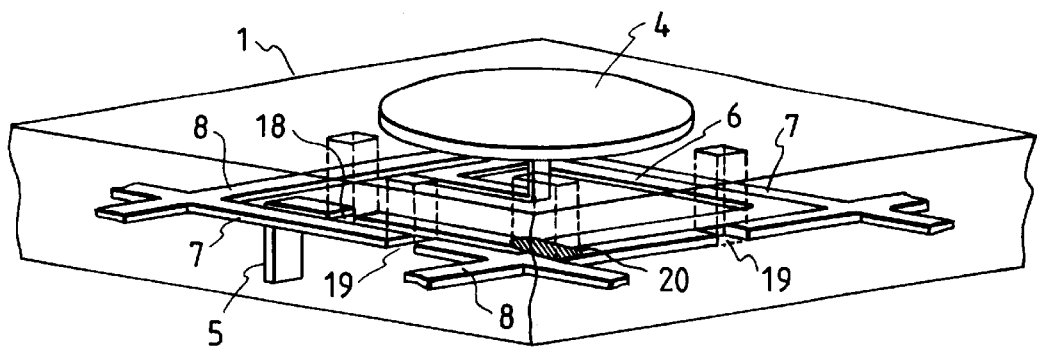
FIGS. 8a to 8c are enlarged views of the essential section of the multilayer circuit substrate shown in FIGS. 7a to 7c after circuit pattern repairing.
Figure 8B:
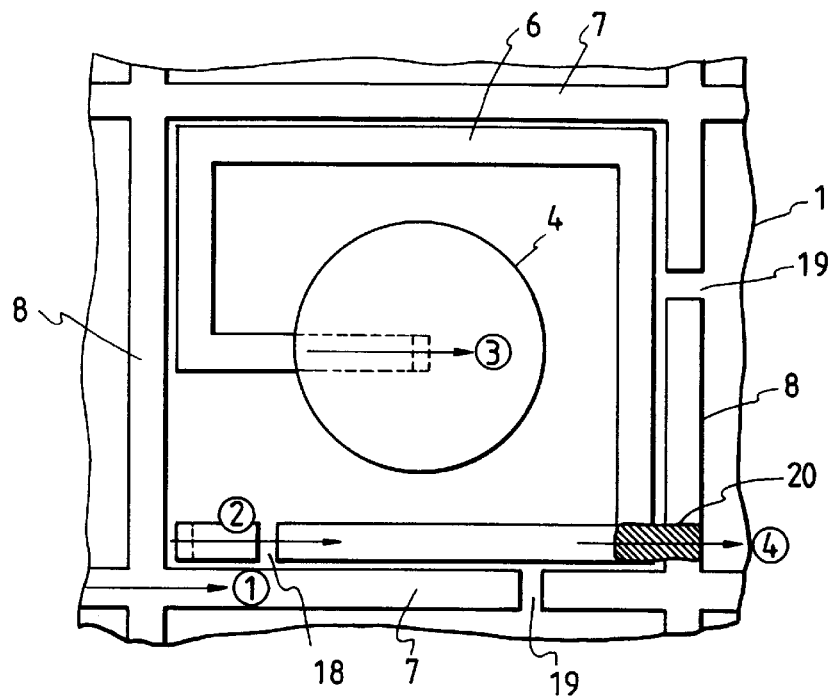
Figure 8C:
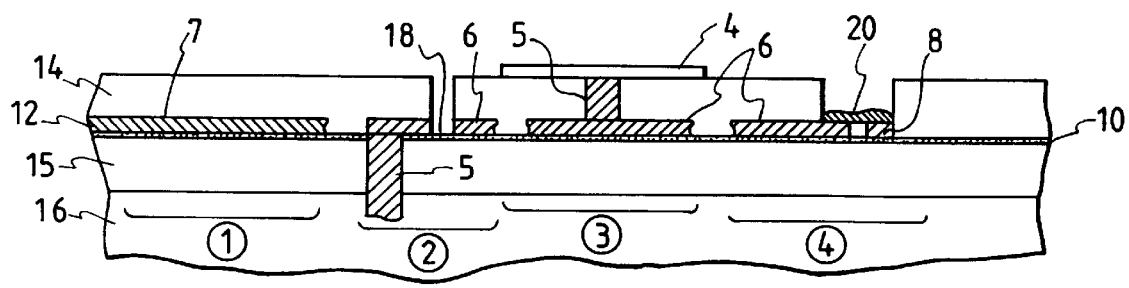

FIGS. 8a to 8c show the circuit pattern structure after the circuit pattern shown in FIGS. 7a to 7c is repaired. FIG. 8a is a perspective squint drawing, and FIG. 8b is a top view, and FIG. 8c is a sectional view along the arrows [1] to [4] shown in FIG. 8b.

Figure 9A:
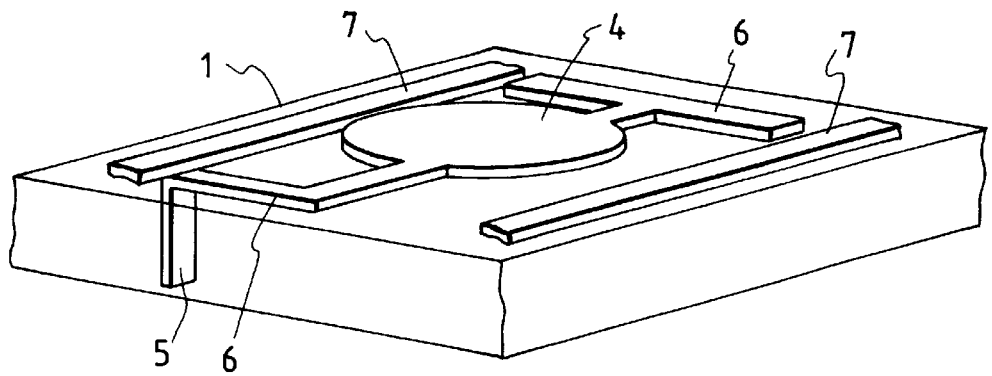
FIGS. 9a to 9c are enlarged views of the essential section of a multilayer circuit substrate of another embodiment of the present invention before circuit pattern repairing.
Figure 9B:
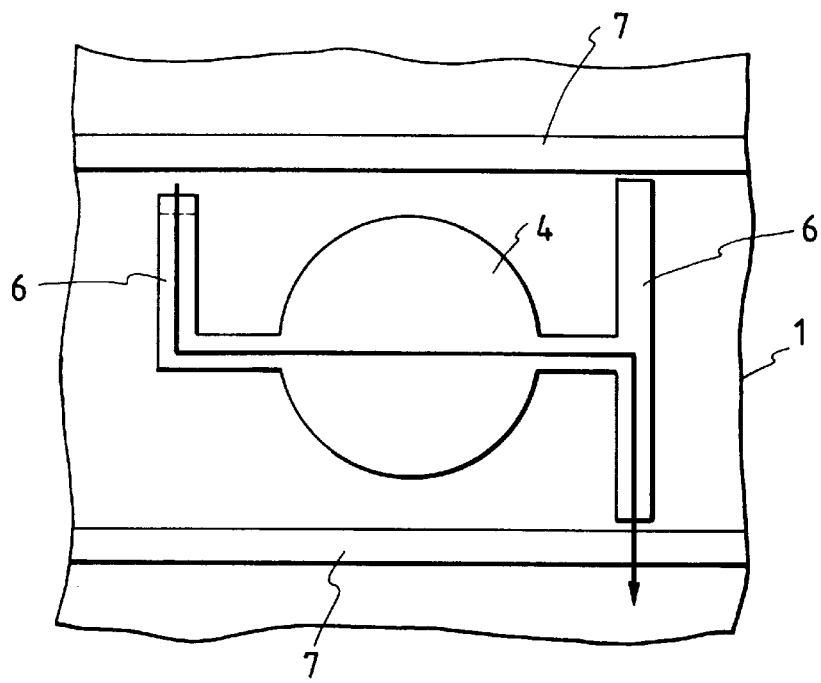
Figure 9C:
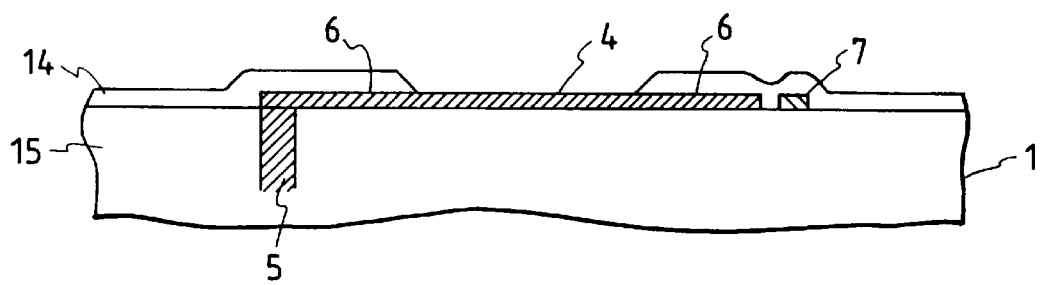

FIGS. 9a to 9c and FIGS. 10a to 10c show an example that the circuit pattern 6 and repair pattern X 7 are arranged on the plane where the terminal bonding pad 4 is set. In the other words, FIGS. 9a to 9c show the circuit pattern structure before main pattern repairing (initial state). FIG. 9a is a perspective squint drawing, and FIG. 9b is a top view, and FIG. 9c is a sectional view along the path indicated by an arrow shown in FIG. 9b. FIGS. 9a and 9b show a state when the insulation film 14 is removed from the substrate surface shown in FIG. 9c.

Figure 10A:
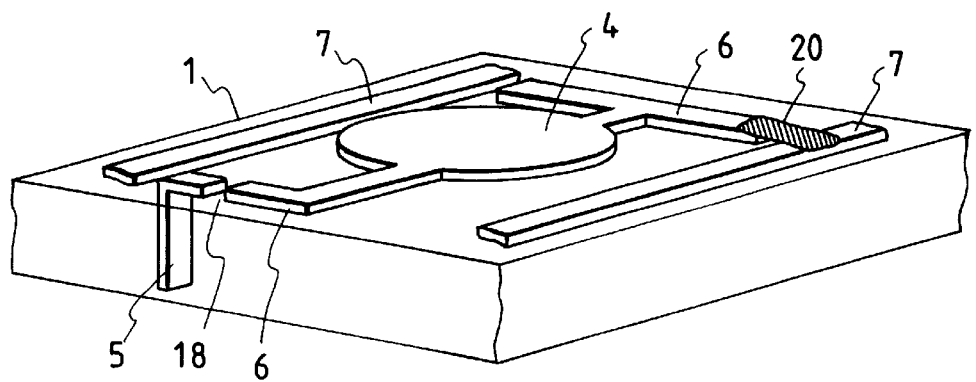
FIGS. 10a to 10c are enlarged views of the essential section of the multilayer circuit substrate shown in FIGS. 9a to 9c after circuit pattern repairing.
Figure 10B:
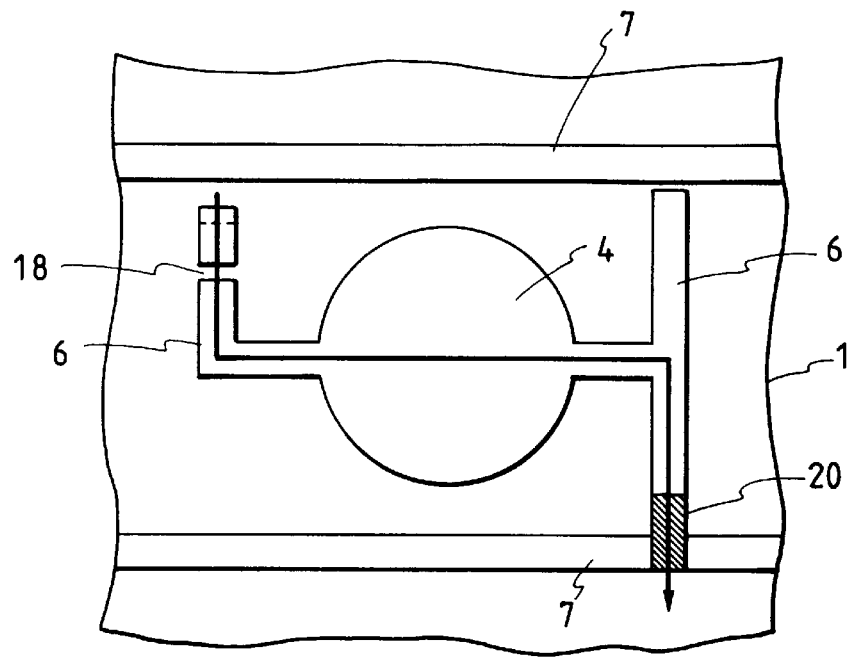
Figure 10C:
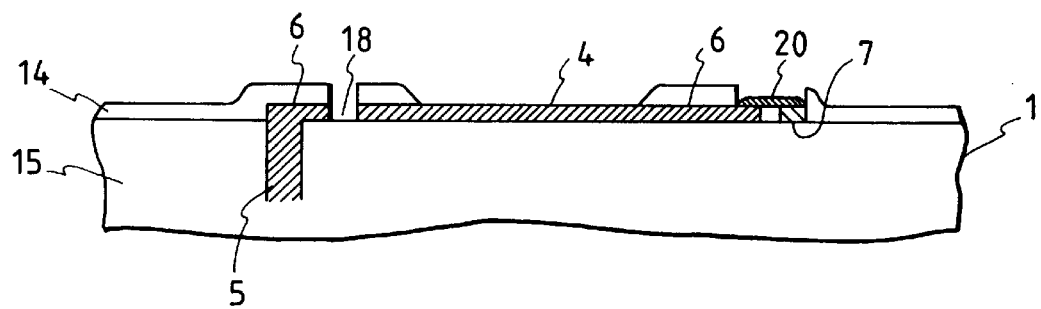

FIGS. 10a to 10c show the circuit pattern structure after the circuit patterns shown in FIGS. 9a to 9c are repaired. FIG. 10a is a perspective squint drawing, and FIG. 10b is a top view, and FIG. 10c is a sectional view along the path indicated by an arrow shown in FIG. 10b.

Figure 11A:
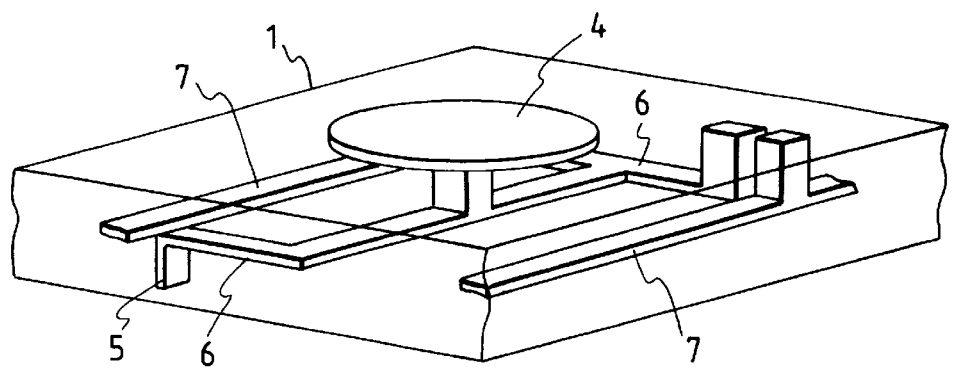
FIGS. 11a to 11c are enlarged views of the essential section of a multilayer circuit substrate of another embodiment of the present invention before circuit pattern repairing.
Figure 11B:
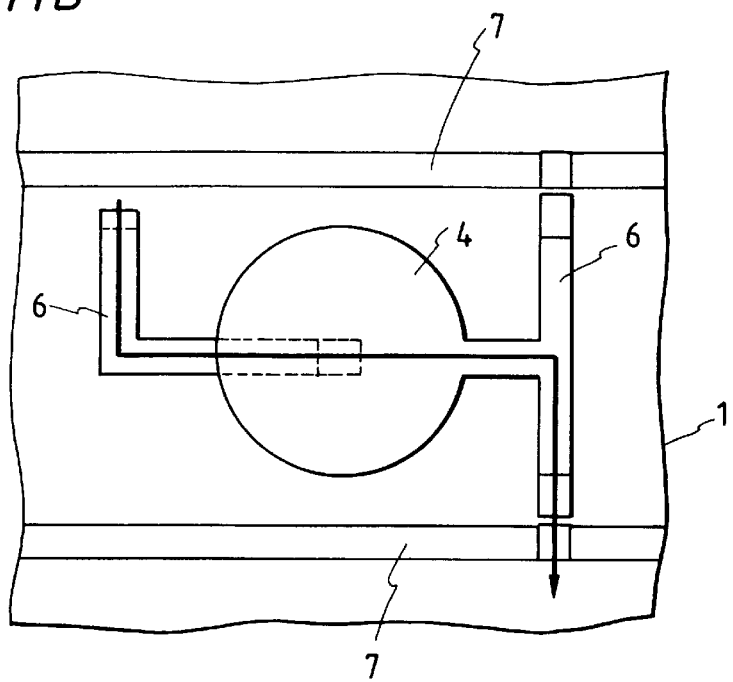
Figure 11C:
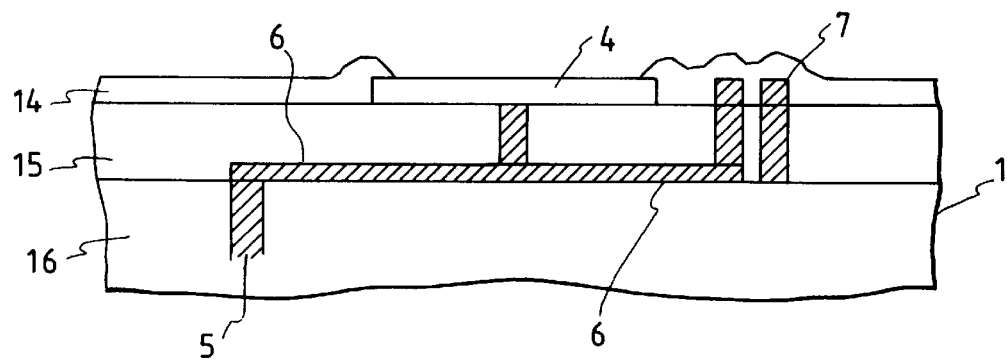

FIGS. 11a to 11c and FIGS. 12a to 12c show an example that the circuit pattern 6 and repair pattern X 7 are arranged on the same plane and only the circuit repairing areas of the two are arranged on the plane where the terminal bonding pad 4 mounted on the substrate surface is set. In the other words, FIGS. 11a to 11c show the circuit pattern structure before main pattern repairing (initial state). FIG. 11a is a perspective squint drawing, and FIG. 11b is a top view, and FIG. 11c is a sectional view along the path indicated by an arrow shown in FIG. 11b. FIGS. 11a and 11b show a state when the insulation film 14 is removed from the substrate surface.

Figure 12A:
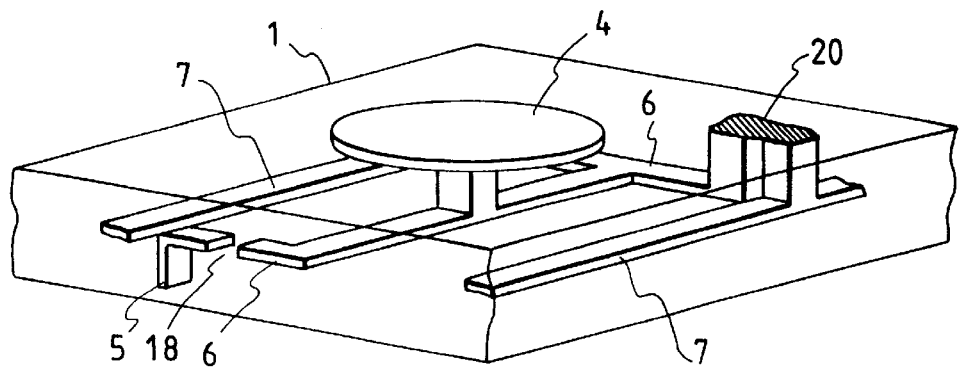
FIGS. 12a to 12c are enlarged views of the essential section of the multilayer circuit substrate shown in FIGS. 11a to 11c after circuit pattern repairing.
Figure 12B:
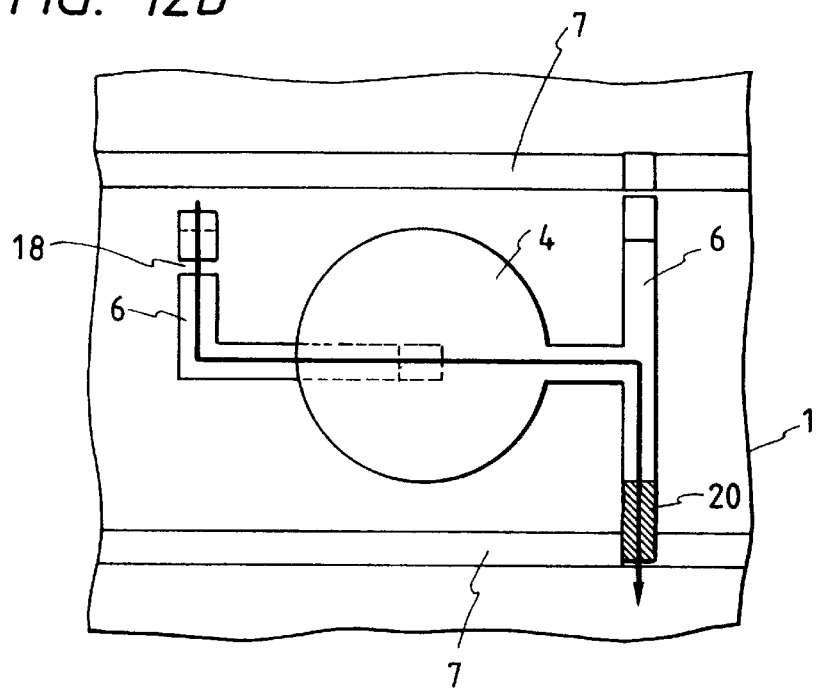
Figure 12C:
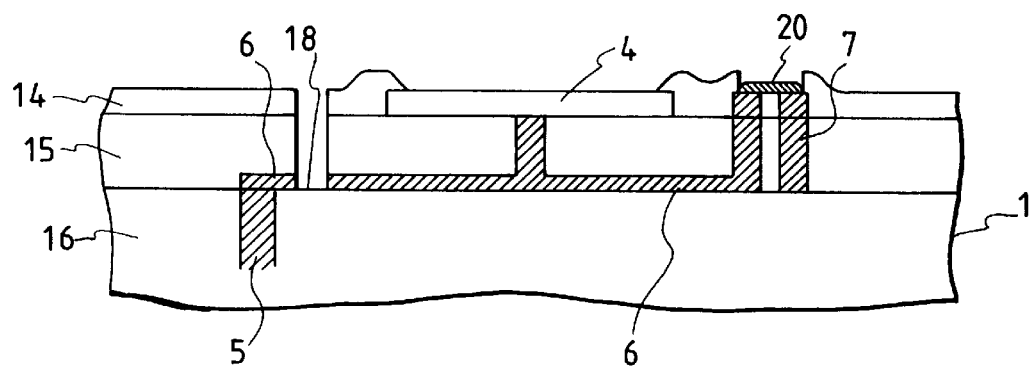

FIGS. 12a to 12c show the circuit pattern structure after the circuit pattern shown in FIGS. 11a to 11c is repaired. FIG. 12a is a perspective squint drawing, and FIG. 12b is a top view, and FIG. 12c is a sectional view along the path indicated by an arrow shown in FIG. 12b.

Next, as to the actual circuit pattern repairing procedure, the repairing procedure of a terminal bonding pad using the examples shown in FIGS. 5a to 5c and FIGS. 6a to 6c will be explained. In other words, a repairing method that one ends of predetermined parts of the circuit pattern 6 whose end is bonded to the terminal bonding pad 4 and of the repair pattern Y 8 which is arranged close to it as shown in FIGS. 5a to 5c are cut (18, 19) and the other ends are bonded (20) as shown in FIGS. 6a to 6c and the terminal bonding pad 4 and repair pattern Y 8 are bonded finally will be explained.

Step 1

First, as shown in FIG. 6, the predetermined part of the circuit pattern 6 bonded to the terminal bonding pad 4 is cut. The cutting position 18 of the circuit pattern 6 is on the inner layer side of the substrate from the part where the circuit pattern is to be bonded to the repair pattern Y 8. A laser beam is used as a circuit cutting means. First, a hole is bored in the inter-substrate insulation film 14 and then the circuit pattern is cut. In this case, the energy density for boring a hole by a laser beam is different by about one digit between the material (a conductor of Cu or Al) of the circuit pattern 6 and the material (polyimide) of the inter-substrate insulation film 15. Therefore, there is a risk that the inter-substance insulation film 15 right under the circuit pattern 6 is damaged (bored) after the circuit pattern is cut. Therefore, a thin insulation film 10 (a barrier such as an oxide film or nitrided film) is formed between the second pattern 12 and inter-substrate insulation film 15 so as to prevent the inter-substrate insulation film from damage due to irradiation of a laser beam.

Step 2

To expose the bonding position of the circuit pattern 6 and repair pattern Y 8, the inter-substrate insulation film 14 is removed by a laser beam and a hole for bonding is bored.

Step 3

A bonding material such as solder foil or a solder ball is inserted into the bonding hole for the circuit pattern 6 and repair pattern Y 8 and melted by irradiation of a laser beam so as to bond the both patterns. In place of this bonding 20, a method of wire bonding, ribbon bonding, or bonding by depositing predetermined metal in the hole by laser CVD may be used.

Step 4

Unnecessary circuit lines are cut off (repair pattern cutting position 19) from the repair pattern Y 8 connected to the circuit pattern 6; that is, the predetermined part of the repair pattern Y 8 is cut off after the inter-substrate insulation film 14 is removed by a laser beam. In place of Step 4, the method for cutting the circuit pattern 6 which is used in Step 1 may be used.

In the boring process for the inter-substrate insulation film by a laser beam in Steps 1, 2, and 4, it is desirable to make the cutting hole and bonding hole different in diameter such that the diameter of the cutting hole is controlled to the necessary minimum limit and smaller than that of the bonding hole. The reason is that when the leveling process is performed for mounting and packaging electronic parts, surplus solder is prevented from entering the inside through the cutting hole and rebonding the cut part of the circuit pattern.

Furthermore, as to determining of the boring position, the hole can be positioned visually because the inter-substrate insulation film is thin and the circuit pattern on the inner layer can be seen from the outside. The circuit pattern may be printed on the substrate surface with insulating ink beforehand as required.

Embodiment 2

Next, an example that the circuit pattern between terminal bonding pads at two locations is repaired via the repair main pattern 9 will be explained with reference to FIGS. 13a, 13b, and 14. The repair main pattern 9 is arranged along the four sides of each LSI chip mounting area 17 as described in FIG. 1 and set on the inner layer in the same way as the other circuit patterns.

Figure 13A:
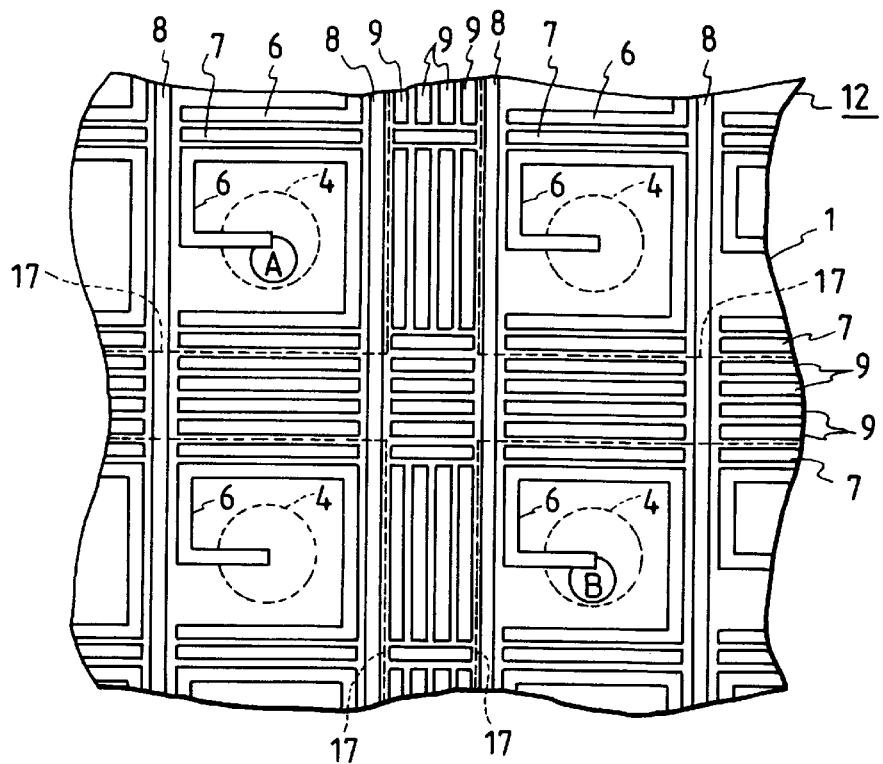
FIGS. 13a and 13b are enlarged views of the essential section of a multilayer circuit substrate of another embodiment of the present invention before and after circuit pattern repairing via a repair main pattern 9.
Figure 13B:
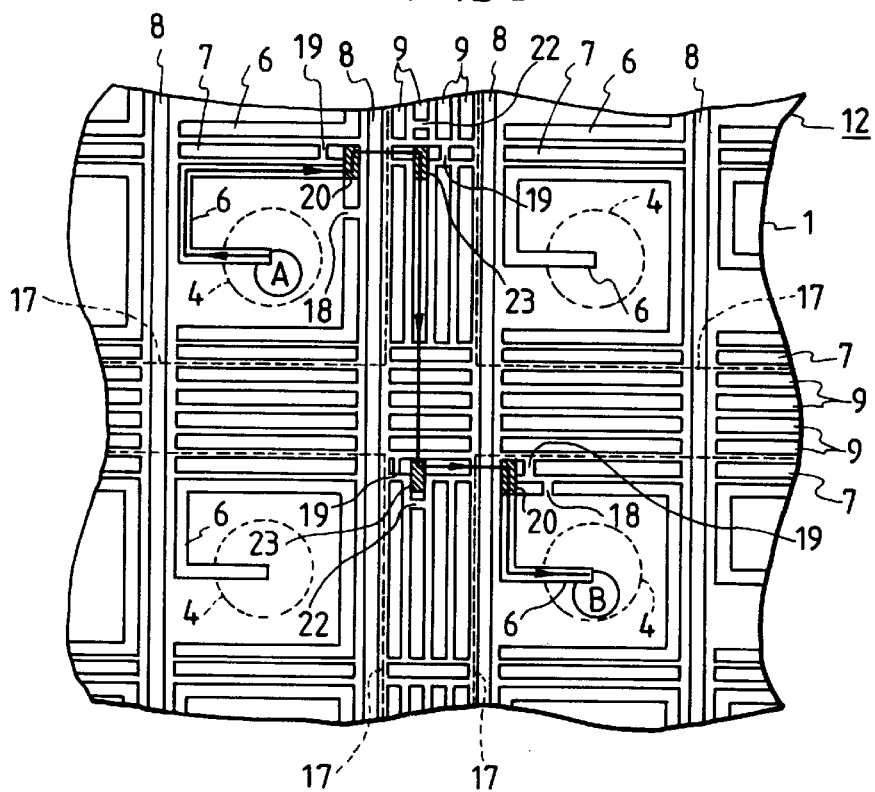
Figure 14:
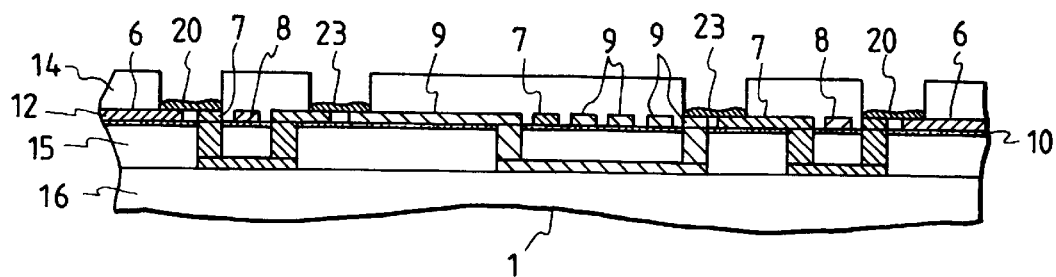
FIG. 14 is a sectional view of the side of the multilayer circuit substrate shown in FIGS. 13a and 13b.

FIGS. 13a and 13b are plan views of the second pattern 12 near a corner of the area where four LSIs 2 are mounted close to each other as shown in the LSI mounting area 17. FIG. 13a shows the state before main pattern repairing (initial state), and FIG. 13b shows the state after main pattern repairing, and FIG. 14 shows a sectional view of the intra-substrate circuit after the circuit is repaired along the arrow shown in FIG. 13b.

The circuit pattern repairing procedure will be explained concretely hereunder using an example that the circuit line between the terminal bonding pad A and terminal bonding pad B shown in FIGS. 13a and 13b is repaired and the two pads A and B are electrically bonded. Since the circuit repairing procedure from the terminal bonding pads A and B to the nearest repair pattern X 7 is the same as Steps 1 to 4 explained in Embodiment 1, the description will be omitted here.

Step 5

At the part (the position of solder 23 for bonding the repair pattern X 7 and repair main pattern 9) where the repair pattern X 7 is to be bonded to the repair main pattern 9, the inter-substrate insulation film 14 is removed using a laser beam and a bonding hole is bored. The boring method is the same as that shown in Embodiment 1.

Step 6

The method for bonding the repair pattern X 7 and repair main pattern 9 which are exposed by boring is the same as that used in Embodiment 1; that is, a bonding material such as solder foil or a solder ball is inserted into the hole and melted by irradiation of a laser beam so as to bond (23) the both patterns.

Step 7

Unnecessary circuit lines are cut off (cutting position 19 of the repair pattern X 7 and cutting position 22 of the repair main pattern 9) from the repair pattern X 7 and repair main pattern 9, which are bonded to each other by Steps 5 and 6, by the procedure used in Embodiment 1.

Figure 15A:
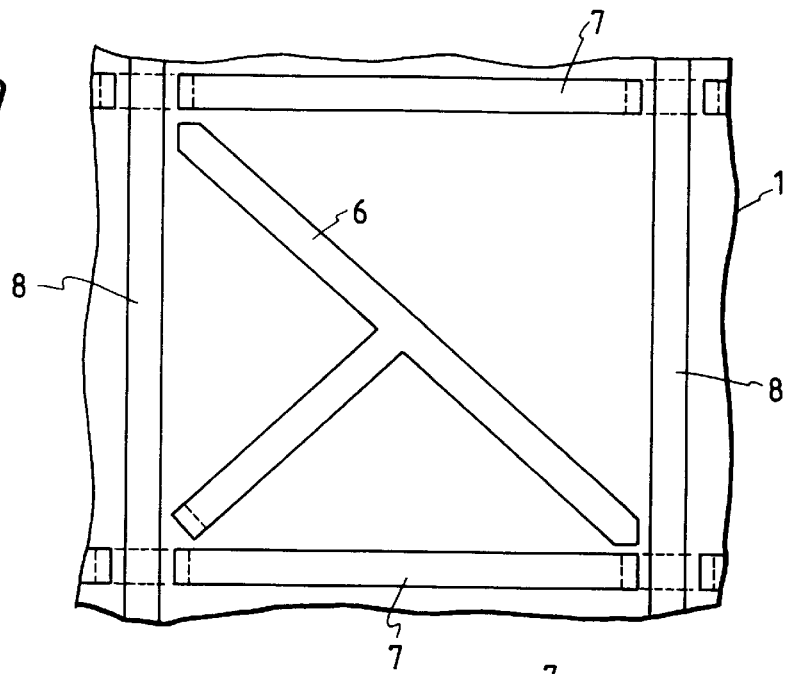
FIGS. 15a and 15b are plan views of a second pattern 12 of a multilayer circuit substrate of another embodiment showing deformation examples of a circuit pattern 6.
Figure 15B:
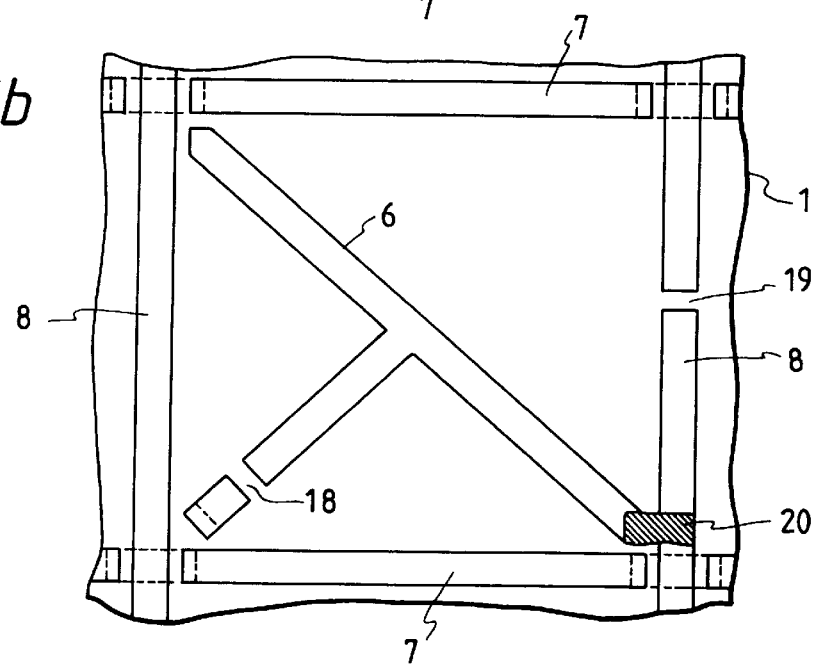

The circuit pattern 6 shown in FIG. 5b is used in the aforementioned embodiment. However, the shape of the circuit pattern 6 may be such that only the repair pattern X 7, repair pattern Y 8, and bonding part are arranged close to each other. As shown in FIG. 15, for example, a T-shaped circuit pattern is used and the both ends are set close to the crossing part of the repair patterns X 7 and Y 8. FIG. 15(a) shows the pattern before repairing and FIG. 15(b) shows the pattern after repairing.

As a bonding method between the circuit lines 6 and 7 and between the circuit lines 7 and 9, solder melting bonding by a laser beam is used in the above embodiment. However, when there are many solder bonding points in the substrate, it is possible to bore holes in the inter-substrate insulation film by a laser beam for all the bonding points first, to insert solder into a each hole, to put the entire substrate into a reflow furnace, and to bond the bonding points in a batch instead of irradiation of a laser beam to each hole so as to improve the operability.

Furthermore, in place of the solder bonding method, for example, wire bonding or ribbon bonding by the supersonic thermocompression bonding method may be used.

Next, FIGS. 16 to 23 show an embodiment of sectional views of an electronic circuit device wherein repairing areas 27 are set on a multilayer circuit substrate 1 or circuit repairing substrates 24 and LSI 2 is mounted on each substrate.

Figure 16:
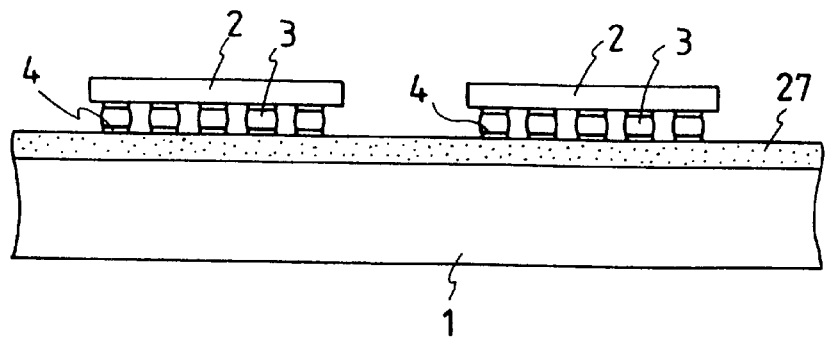
FIG. 16 shows an embodiment of the section of an electronic circuit device wherein a repairing area is set on a multilayer circuit substrate and the circuit pattern can be repaired via a repair main pattern.
Figure 17:
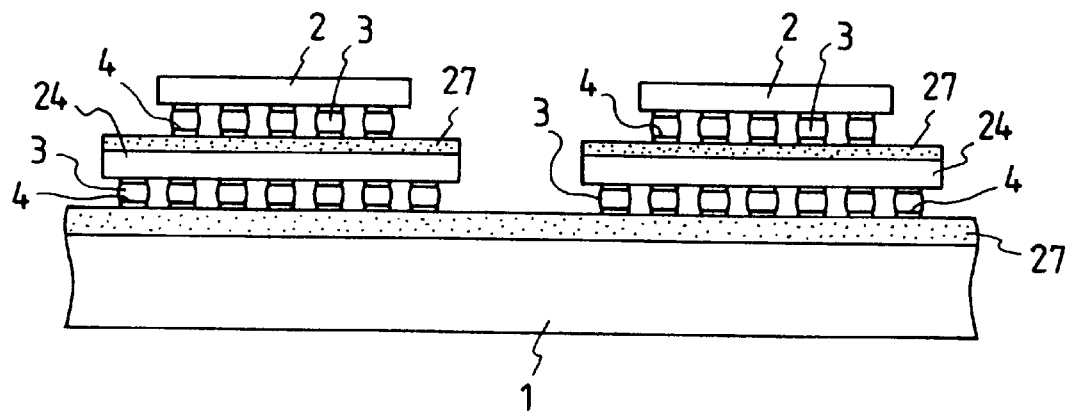
FIG. 17 shows an embodiment showing the section of an electronic circuit device wherein repairing areas are set on a multilayer circuit substrate and on the surface of a circuit repairing substrate and the circuit pattern can be repaired via a repair main pattern.
Figure 18:
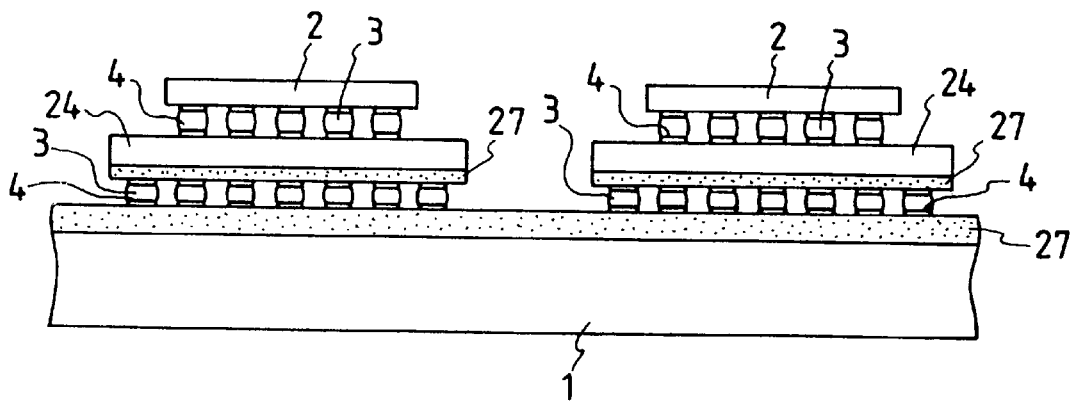
FIG. 18 shows an embodiment showing the section of an electronic circuit device wherein repairing areas are set on a multilayer circuit substrate and on the back of a circuit repairing substrate and the circuit pattern can be repaired via a repair main pattern.
Figure 19:
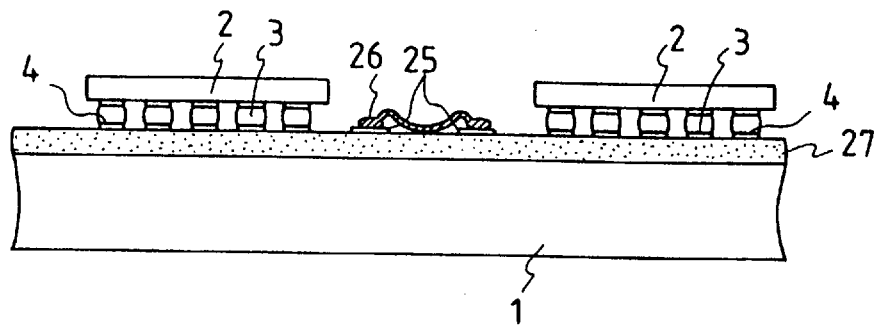
FIG. 19 shows an embodiment showing the section of an electronic circuit device wherein a repairing area is set on a multilayer circuit substrate and the circuit pattern can be repaired via wire bonding between the repairing pads.
Figure 20:
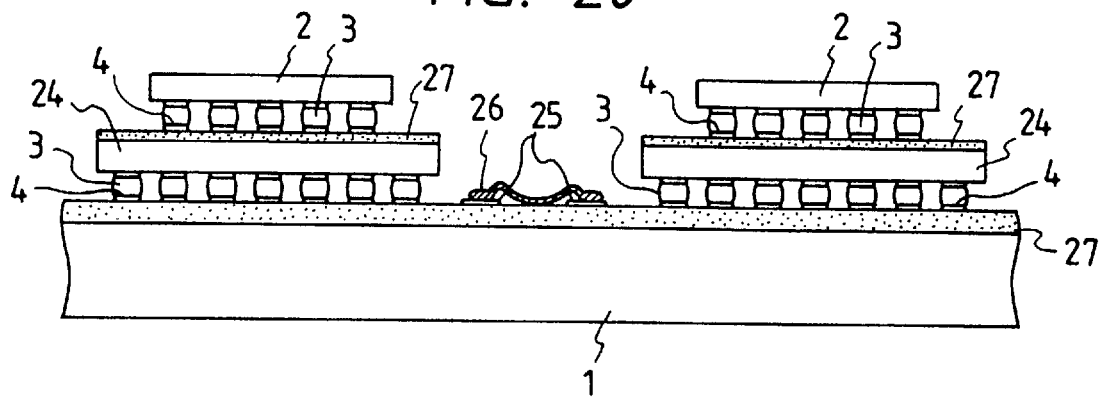
FIG. 20 shows an embodiment showing the section of an electronic circuit device wherein a thin layer is set on a multilayer circuit substrate, and a repairing area is set on the surface of a circuit repair substrate, and the circuit pattern can be repaired via wire bonding between the repairing pads.
Figure 21:
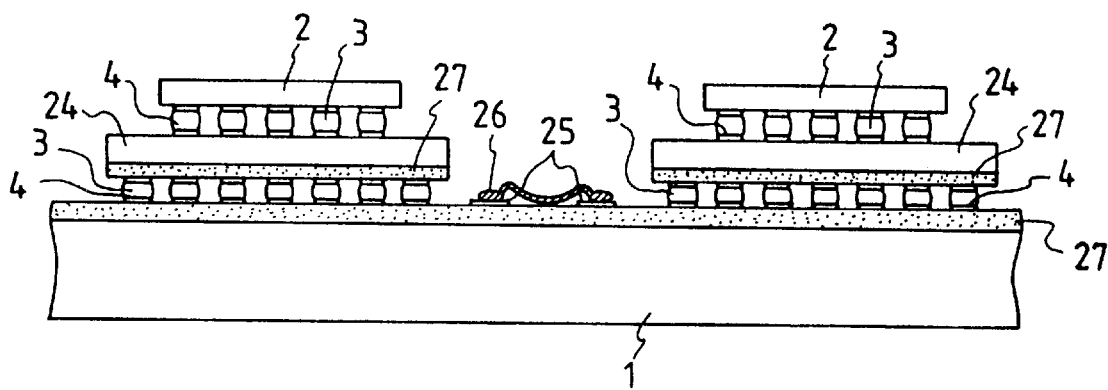
FIG. 21 shows an embodiment showing the section of an electronic circuit device wherein a thin layer is set on a multilayer circuit substrate, and a repairing area is set on the back of a circuit repair substrate, and the circuit pattern can be repaired via wire bonding between the repairing pads.

In the repairing area 27 in each drawing, one of the aforementioned circuit pattern 6, repair patterns 7 and 8, repair main pattern 9, and bonding and cutting parts between the circuit pattern and the repair pattern is included. FIGS. 16 to 18 show an example when the repair main pattern 9 is used so as to bond LSI2s and FIGS. 19 to 23 show an example when the repair pads 25 are bonded by wire bonding 26 so as to bond LSI2s. In FIGS. 17, 18, 20, 21, 22, and 23, a repairing area 27 is set on the front or back of each of the circuit repairing substrates 24.

Figure 22:
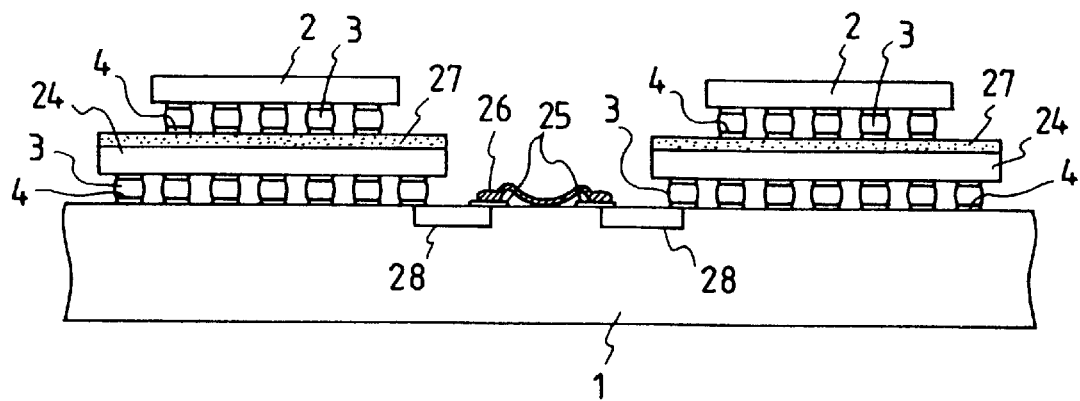
FIG. 22 shows an embodiment showing the section of an electronic circuit device wherein a circuit repair substrate with a repairing area set on the surface thereof is mounted on a multilayer circuit substrate and the circuit pattern can be repaired via wire bonding between the repairing pads.
Figure 23:
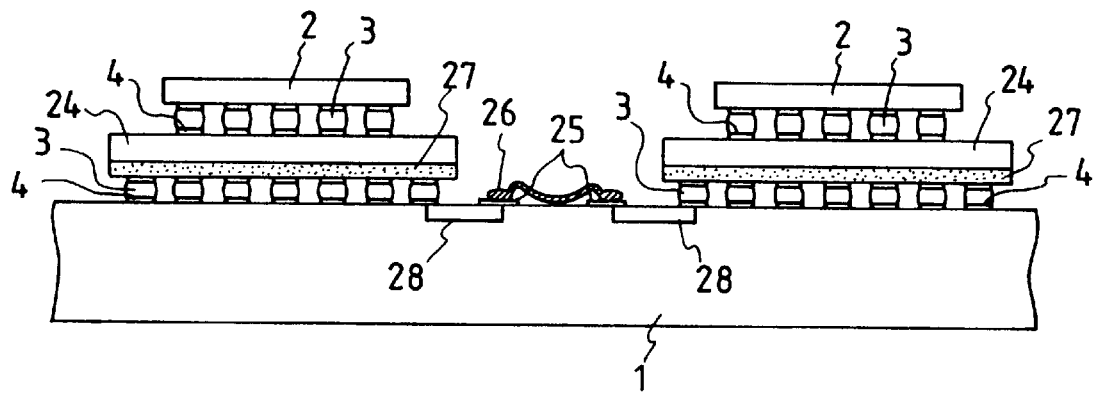
FIG. 23 shows an embodiment showing the section of an electronic circuit device wherein a circuit repair substrate with a repairing area set on the back thereof is mounted on a multilayer circuit substrate and the circuit pattern can be repaired via wire bonding between the repairing pads.

In FIGS. 22 and 23, the circuit repairing substrate is mounted on the ceramic thick multilayer circuit substrate 1 and thick layer conductor circuit lines (tungsten, molybdenum, etc.) 28 is arranged for bonding each terminal bonding pad 4 and repairing pad 25 on the multilayer circuit substrate 1.

As mentioned above, according to this embodiment, the circuit lines are cut or bonded on the inner layer of the substrate, so that the pattern cut parts can be prevented from rebonding due to surplus solder in the leveling process and the reliability of the repaired parts can be improved.

Since the circuit pattern 6, repair patterns 7 and 8, and repair main pattern 9 are set on the same plane, the pattern repairing part (pattern cutting and bonding) positioning accuracy, substrate quality, and operability can be improved and the packaging density of a multilayer circuit substrate with a circuit pattern repairing function can be improved substantially.

As mentioned above in detail, the intended objects can be accomplished by the present invention. In the multilayer circuit substrate with a circuit pattern repairing function or circuit repairing substrate of the present invention, a repair pattern is set on the inner layer and the circuit pattern and repair pattern are arranged on the same plane, so that the circuit can be repaired easily in the substrate, and the reliability of repaired parts in the leveling process, operability, and circuit line positioning accuracy are improved, and the packaging density of the multilayer circuit substrate can be increased substantially. The substrate circuit repairing method is simple such that it consists of three existing processes such as boring holes in the inter-substrate insulation film, cutting unnecessary patterns, and bonding neighboring circuit lines and suited to automation and can be executed easily. Furthermore, in an electronic circuit device wherein electronic parts are mounted and bonded on the multilayer circuit substrate with a circuit pattern repairing function or circuit repairing substrate of the present invention, the reliability and packaging density are high, so that the device can be made compact.

What is claimed is:

1. A multilayer circuit substrate with a circuit repairing function comprising:

a circuit substrate having an inner inter-substrate insulation film layer having a surface lying substantially along a single common plane, a covering insulation film layer covering the surface of the inner layer, a circuit pattern, and a repair pattern, both the circuit pattern and the repair pattern being defined on the surface of the inner inter-substrate insulation film layer and covered with the covering insulation film layer, the circuit pattern having repairing areas for cutting and bonding to the repair pattern such that selected portions of the repair pattern are selectively connected to the repairing areas of the circuit pattern in repairing defective portions of the circuit pattern, both the repairing areas of the circuit pattern and the repair pattern being disposed (1) in close proximity and (2) in said single common plane; and, a terminal bonding pad for bonding electronic circuit parts thereto, the terminal bonding pad being mounted on the inner inter-substrate insulation film layer surface in said single common plane, wherein all of the repairing areas of the circuit pattern, the repair pattern and the terminal bonding pad are disposed in said single common plane.

2. A multilayer circuit substrate according to claim 1, wherein said repair pattern is further arranged so that it encloses said circuit pattern on the common plane.

3. A multilayer circuit substrate according to claim 1, wherein said repair pattern comprises a crossing two-way lattice pattern including an X repair pattern and a Y repair pattern so that it encloses said circuit pattern, and at least the selected portion of the repair pattern is positioned on the common plane with said circuit pattern.

4. A multilayer circuit substrate according to claim 3, wherein a crossing part of said X and Y repair patterns includes a three-dimensional crossing part and wherein one of the X and Y repair patterns is bonded to a lower layer repair pattern via a conductive via and the two are kept insulated by the inter-substrate insulation film.

5. A multilayer circuit substrate according to claim 3, wherein a crossing part of the X and Y repair patterns has a structure that bonds the X and Y repair patterns to each other so as to retain electrical continuity.

6. A multilayer circuit substrate according to claim 1, wherein mounting areas where the electronic circuit parts are mounted in a matrix state are formed close to each other on said circuit substrate, and said repair pattern is arranged in a projection area of the mounting area, and an end of the repair pattern extends to a periphery of said projection area of the mounting area and is located on a same surface as that of the terminal bonding pad and an insulation film at the end throuah a via, and the circuit pattern operatively disposed between the electronic circuit parts mounted on the circuit substrate can be repaired.

7. The substrate according to claim 1, wherein an insulation film barrier is arranged between said repair pattern, said circuit pattern, and the inter-substrate insulation film.

8. The substrate according to claim 1 wherein the terminal bonding pad is mounted in a mounting area on said substrate and terminals of the electronic circuit parts are electrically bonded thereto.

9. A circuit repairing substrate for accommodating repairs between a multilayer circuit substrate and electronic circuit parts which are mounted on the multilaver circuit substrate, the circuit repairing substrate comprising:

a repair pattern on an inner layer of an inter-substrate insulation film of the multilayer circuit substrate, the repair pattern having selected portions completely disposed in a single common plane for cutting and bonding with corresponding repair areas of a circuit pattern disposed in said single common plane, the selected portions of the repair pattern and the repairing areas of circuit pattern both being disposed on said inner layer of the inter-substrate insulation film closely adjacent and in said single common plane;

a terminal bonding pad for bonding the electronic circuit parts thereto, the terminal bonding pad being disposed in the single common plane of the inter-substrate, wherein the repairing areas of the circuit pattern, the repair pattern and the terminal bonding pad are disposed in the single common plane and the cutting and bonding portions are positioned on the single common plane.

10. The substrate according to claim 9 wherein the terminal bonding pad is mounted in a mounting area on said multilayer circuit substrate, the terminal bonding pad being on the circuit repairing substrate, and terminals of the electronic circuit parts are electrically bonded to the terminal bonding pads.

* * * * *